(12) United States Patent
Garlapati et al.

(10) Patent No.: US 7,352,207 B2
(45) Date of Patent: Apr. 1, 2008

(54) OUTPUT DRIVER WITH COMMON MODE FEEDBACK

(75) Inventors: Akhil K. Garlapati, Woburn, MA (US); Axel Thomsen, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 183 days.

(21) Appl. No.: 11/239,944

(22) Filed: Sep. 30, 2005

(65) Prior Publication Data

US 2007/0075776 A1    Apr. 5, 2007

(51) Int. Cl.
*H03K 19/094* (2006.01)
*H03K 19/0175* (2006.01)
*H01L 5/00* (2006.01)

(52) U.S. Cl. .................. 326/68; 326/62; 326/80; 326/82; 327/333; 330/261

(58) Field of Classification Search ............. 326/62, 326/68, 80–83, 86, 87, 67, 95, 98, 112, 115, 326/121
See application file for complete search history.

(56) References Cited

U.S. PATENT DOCUMENTS

| 5,121,080 | A |   | 6/1992  | Scott, III et al. |
|-----------|---|---|---------|-------------------|
| 5,374,861 | A |   | 12/1994 | Kubista |
| 5,402,485 | A |   | 3/1995  | Takato et al. |
| 5,550,496 | A |   | 8/1996  | Desroches |
| 5,570,037 | A |   | 10/1996 | Llorens |
| 5,939,904 | A | * | 8/1999  | Fetterman et al. ............ 327/67 |
| 6,028,479 | A | * | 2/2000  | Babanezhad ................ 330/253 |
| 6,054,881 | A |   | 4/2000  | Stoenner |
| 6,147,520 | A |   | 11/2000 | Kothandaraman et al. |
| 6,280,011 | B1 |   | 8/2001  | Schloeman et al. |
| 6,281,702 | B1 |   | 8/2001  | Hui |
| 6,300,802 | B1 |   | 10/2001 | Smetana |
| 6,433,579 | B1 |   | 8/2002  | Wang et al. |
| 6,437,599 | B1 |   | 8/2002  | Groen |
| 6,445,223 | B1 |   | 9/2002  | Thilenius |
| 6,504,397 | B1 |   | 1/2003  | Hart et al. |
| 6,529,070 | B1 | * | 3/2003  | Nagaraj ....................... 330/9 |

(Continued)

OTHER PUBLICATIONS

Heydari, Payam, "Design Issues in Low-Voltage High-Speed Current-Mode Logic Buffers," GLSVLSI'03, Apr. 28-29, 2003, 6 pages, Washington, DC, USA.

(Continued)

*Primary Examiner*—Rexford Barnie
*Assistant Examiner*—Dylan White
(74) *Attorney, Agent, or Firm*—Zagorin O'Brien Graham LLP

(57) ABSTRACT

A complementary metal-oxide semiconductor output driver provides a differential output signal having a particular differential voltage swing and a particular common mode voltage to a differential output node for various types of load circuits coupled to the differential output node. The load circuit may have any impedance within a particular impedance range. A current source provides a current with a variable current component that adjusts the differential voltage swing of the differential output signal. A common mode feedback circuit adjusts the common mode voltage of the differential output signal by sourcing current to the differential output node or sinking current from the differential output node. At least a portion of a current flowing into a load circuit coupled to the differential node is provided by the current source, thereby reusing current from the current source.

29 Claims, 7 Drawing Sheets

U.S. PATENT DOCUMENTS

| | | | |
|---|---|---|---|
| 6,580,292 | B2 | 6/2003 | West et al. |
| 6,603,329 | B1 | 8/2003 | Wang et al. |
| 6,664,814 | B1 | 12/2003 | Evans et al. |
| 6,670,830 | B2 | 12/2003 | Otsuka et al. |
| 6,700,403 | B1 | 3/2004 | Dillon |
| 6,744,275 | B2 | 6/2004 | Chansungsan |
| 6,744,280 | B2 * | 6/2004 | Morgan et al. ............ 326/86 |
| 6,760,381 | B2 * | 7/2004 | Lu .......................... 375/257 |
| 6,812,734 | B1 | 11/2004 | Shumarayev et al. |
| 6,815,980 | B2 | 11/2004 | Kerr |
| 6,856,178 | B1 * | 2/2005 | Narayan ................. 327/108 |
| 6,940,302 | B1 | 9/2005 | Shumarayev et al. |
| 6,963,219 | B1 | 11/2005 | Ghia et al. |
| 7,012,450 | B1 * | 3/2006 | Oner et al. ................ 326/86 |
| 7,034,574 | B1 * | 4/2006 | Li ............................ 326/83 |
| 7,088,181 | B1 * | 8/2006 | Voo ......................... 330/258 |
| 7,145,359 | B2 | 12/2006 | Hein et al. |
| 2004/0174215 | A1 * | 9/2004 | Li et al. ................. 330/253 |
| 2005/0184805 | A1 * | 8/2005 | Murakami .............. 330/261 |
| 2005/0212553 | A1 | 9/2005 | Best et al. |
| 2005/0237082 | A1 * | 10/2005 | Shumarayev et al. ........ 326/26 |
| 2005/0285629 | A1 * | 12/2005 | Hein et al. .............. 326/115 |
| 2006/0022753 | A1 * | 2/2006 | Bonaccio et al. .......... 330/258 |
| 2006/0082415 | A1 * | 4/2006 | Gopinathan et al. ....... 330/253 |
| 2006/0091931 | A1 * | 5/2006 | Leete ....................... 327/382 |

OTHER PUBLICATIONS

Von Herzen, Brian and Brunetti, Jon, "Virtex-E LVPECL Receivers in Multi-Drop Applications," XILINX Application Note: Virtex-E Family, Feb. 24, 2000, 8 pages, XAPP237, v1.1, retrieved from URL www.xilinx.com.

"HiPerClockS (TM) Application Note, 3.3V LVPECL Driver Termination," Integrated Circuit Systems, Inc., Aug. 2, 2002, 7 pages, retrieved from URL www.icst.com/products/hiperclocks.html.

"High-Speed PECL an LVPECL Termination," Micrel Semiconductor, (no date) 2 pages, retrieved from URL www.micrel.com/solutions.shtml.

Ma, Jimmy, "Termination Schemes and Design Guidelines for 3.3V LVPECL Driver," Application Note #73, Pericom Semiconductor Corporation, San Jose, CA, May 19, 2004, 2 pages, retrieved from URL www.pericom.com.

Yang, Ken, "Modified LDO Regulator Sinks PECL-Termination Current," Planet Analog, Jun. 28, 2005, 4 pages, retrieved Sep. 2, 2005 from URL http://www.planetanalog.com/showArticle?articleID=164903593.

"Optimizing Design and Layout for the Si5318/20/21/64 Clock ICs," Silicon Laboratories Product Sheet AN59, Rev. 1.0, Jun. 2005, 20 pages.

Boni, Andrea, et al., "LVDS I/O Interface for Gb/s-per-Pin Operation in 0.35-μm CMOS," *IEEE Journal of Solid-State Circuits*, vol. 36, No. 4, Apr. 2001, pp. 706-711.

Chen, Mingdeng, et al., "Low-Voltage Low-Power LVDS Drivers," *IEEE Journal of Solid-State Circuits*, vol. 40, No. 2, pp. 472-479, Feb. 2005.

Goldie, John, "LVDS, CML, ECL-differential interfaces with odd voltages," http://www.planetanalog.com/ Jan. 21, 2003, 9 pages.

Ju, Jeff, "Interfacing LVDS with other differential-I/O types," www.edn.com, Oct. 30, 2003, 4 pages.

Kumric, Marijan, et al., "Digitally tuneable on-chip line termination resistor for 2.6Gbit/s LVDS receiver in 0.25μ standard CMOS technology," in *Proceedings of the 27th European Solid-State Circuits Conference (ESSCIRC 2001)*, Sep. 18-20, 2001, pp. 241-244.

MAXIM High-Frequency/Fiber Communications Group, "Introduction to LVDS, PECL, and CML," Application Note: HFAN-1.0, Rev. 0, 9/00, pp. i-14.

* cited by examiner

OUTPUT DRIVER WITH COMMON MODE FEEDBACK

BACKGROUND

1. Field of the Invention

The present invention relates to integrated circuits, and more particularly to output buffers of integrated circuits.

2. Description of the Related Art

Devices producing clocks for use in a system may communicate with a variety of types of input buffers, each type having its own signal swing, common mode requirements, and input impedance. Traditionally, clock source integrated circuits produce outputs which have a predetermined signal format for a particular load impedance. However, the termination requirements for matching the input impedance of the input buffer and the impedance of a transmission line coupling the output buffer to the input buffer vary the load seen by the output buffer. Integrated circuit designers have used various techniques to provide an interface between output buffers and input buffers having different signal formats and/or different termination requirements.

For example, an integrated circuit may provide multiple output buffers compatible with multiple output signal formats and/or multiple termination requirements by including duplicate output bond pads. Each bond pad (or pair of pads for differential formats) has a corresponding output buffer circuit. During a packaging process, the desired pads are bonded to package pins and the unconnected pads and buffer are unused. While this approach allows one integrated circuit to generate multiple signal formats, extra area and power are consumed by the unused buffer and pads, and the particular output buffer must be selected during the packaging process.

Another technique for providing an interface between output buffers and input buffers having different signal formats and/or termination requirements includes designing separate integrated circuits for each output signal format and/or load to avoid wasting die area of unused buffer(s). This approach introduces additional mask costs if the designs are processed on separate mask sets. Like the former technique, the output buffer must be selected during the packaging process. Both of the former and latter techniques require additional inventory because stock must be kept for each part number.

Conversion buffers may be used to provide an interface between input and output buffers having different signal formats and/or termination requirements. This approach allows one integrated circuit to be used in multiple applications requiring different numbers and types of loads. However, conversion buffers introduce the costs of additional board space and additional clock jitter. For high precision applications, the buffer jitter can significantly degrade system performance.

Accordingly, improved techniques for providing an output signal are desired.

SUMMARY

A complementary metal-oxide semiconductor output driver provides a differential output signal having a particular differential voltage swing and a particular common mode voltage to a differential output node for various types of load circuits coupled to the differential output node. The load circuit may have any impedance within a particular impedance range. A current source provides a current with a variable current component that adjusts the differential voltage swing of the differential output signal. A common mode feedback circuit adjusts the common mode voltage of the differential output signal by sourcing current to the differential output node or sinking current from the differential output node. At least a portion of a current flowing into a load circuit coupled to the differential node is provided by the current source, thereby reusing current from the current source.

In at least one embodiment of the invention, an integrated circuit includes a buffer circuit including a differential input node, a common node, a differential pair of devices coupled to the differential input node and the common node, a differential output node, and a current source coupled to the common node. The buffer circuit is configured to provide a differential output signal on the differential output node. The differential output signal has a differential voltage swing and a common mode voltage. The differential output signal is provided based on at least a differential input signal on the differential input node, a particular differential voltage swing, a particular common mode voltage, the differential voltage swing of the differential output signal, and the common mode voltage of the differential output signal.

In at least one embodiment of the invention, a method includes providing a differential output signal to a differential output node. The differential output signal has a differential voltage swing and a common mode voltage. The differential output signal is based on at least a differential input signal, a particular differential voltage swing, a particular common mode voltage, the differential voltage swing of the differential output signal, and the common mode voltage of the differential output signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED
EMBODIMENT(S)

Figure 1:
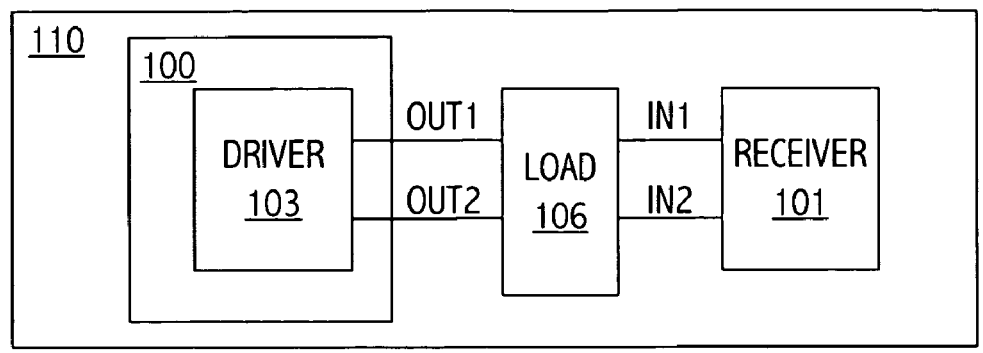
FIG. 1 is block diagram illustrating an exemplary printed circuit board consistent with at least one embodiment of the invention.
Figure 2:
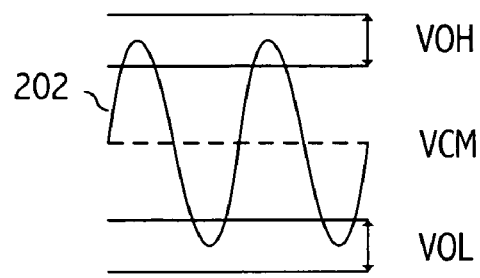
FIG. 2 is an exemplary voltage waveform consistent with at least one embodiment of the invention.

Referring to FIG. 1, printed circuit board 110 includes an exemplary circuit, (e.g., driver circuit 103) on integrated circuit 100, that is configured to provide a differential output signal (e.g., a differential signal on differential output node OUT1 and OUT2) consistent with a particular signaling technique, e.g., differential low-voltage positive emitter-coupled logic (LVPECL) signaling. The signaling technique specifies a particular differential voltage swing and a particular common mode output voltage, as illustrated by waveform 202 in FIG. 2. The high voltage of the differential output voltage illustrated by waveform 202, i.e., VOH, varies between approximately VCC-0.88V and approximately VCC-1.025V. The low voltage of the differential output voltage illustrated by waveform 202, i.e., VOL, varies between approximately VCC-1.62V and approximately VCC-1.81V. The common mode output voltage illustrated by waveform 202, VCM, is approximately VCC-1.3V. However, driver circuit 103 may support this and/or other output standards e.g., the LVDS (low-voltage differential signaling), LVPECL input, and CML (current-mode logic) voltage specifications summarized in Table 1. In addition, circuits associated with the invention described herein may be modified to comply with various other electrical specifications.

Integrated circuit 100 may be a microprocessor, a clock source integrated circuit, or other integrated circuit product. The differential output node of integrated circuit 100 may be coupled to a load circuit 106. For example, differential output node OUT1 and OUT2 is coupled to inputs of an exemplary receiver circuit (e.g., IN1 and IN2 of receiver 101) by traces on printed circuit board 110, which are finite-length transmission lines. To reduce signal reflections and corresponding signal degradation on those transmission lines, the finite-length transmission lines are coupled to a load (e.g., load 106) that makes the finite-length transmission lines behave as if they are infinite in length, i.e., the individual transmission lines are terminated by an impedance having a value approximately equal value to the characteristic impedance of a respective transmission line. Exemplary load circuit 106 may be designed according to at least the effective impedance produced by the characteristic impedance of the transmission line and the input impedance of receiver 101. An effective load impedance seen by driver 103 is based on at least the output impedance of driver 103 and the impedance of load circuit 106. An exemplary driver 103 may be designed to provide an output signal meeting a particular voltage specification for a particular effective load impedance. However, if the actual effective load impedance seen by driver 103 varies from that particular effective load impedance, the output signal provided by driver 103 may fail to meet the particular voltage specification.

Figure 3A:
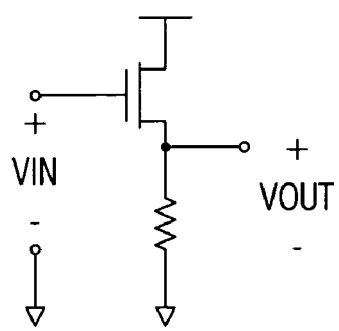
FIG. 3A is circuit diagram illustrating an exemplary output circuit.
Figure 3B:
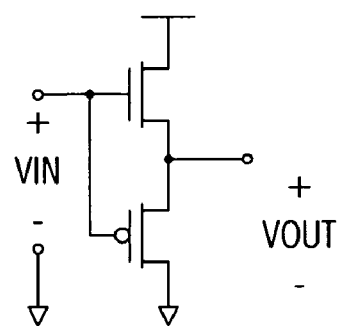
FIG. 3B is circuit diagram illustrating an exemplary output circuit.

A classic PECL driver, i.e., a driver that sources current to the output node or sinks current from the output node, may be implemented with a bipolar circuit including an emitter-follower device configuration. An exemplary CMOS (i.e., complementary metalOoxide semiconductor) implementation of a classic PECL driver may include a conventional CMOS circuit, e.g., a circuit including a source-follower device configuration (FIG. 3A) or a push-pull device configuration (FIG. 3B), that may source currents to a node and sink currents from the node. However, at lower supply voltages (i.e., 3.3V or below, e.g., 2.5V or 1.8V), insufficient voltage headroom may impact circuit performance. In addition, to perform at high speeds of operation (i.e., at frequencies greater than approximately 10 MHz, e.g., approximately 10 MHz to approximately 1.425 GHz), low threshold voltage devices may be used for at least a portion of driver 103. However, such low threshold voltage devices may have reliability issues since driver 103 is coupled off-chip to voltages at 3.3V or greater. Use of high threshold voltage devices in driver 103 reduce such reliability issues, but operate at lower speeds and may not meet performance specifications.

Figure 4:
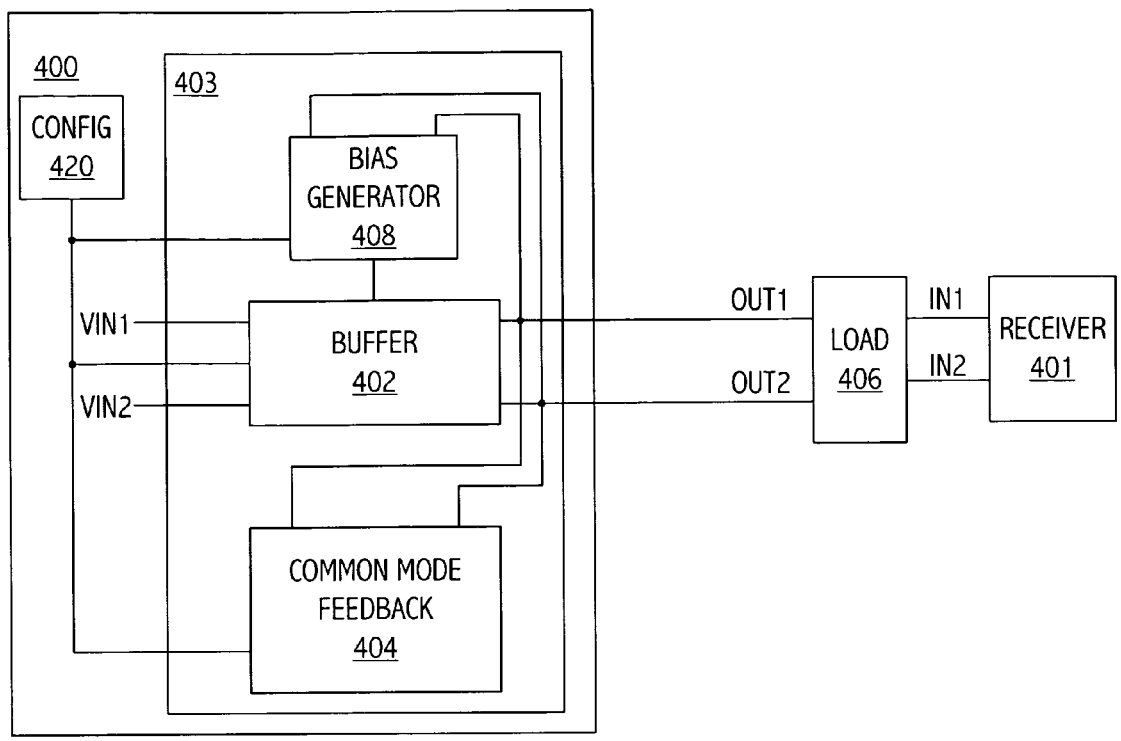
FIG. 4 is a block diagram illustrating an output driver consistent with at least one embodiment of the invention.

Referring to FIG. 4, CMOS integrated circuit 400 includes driver circuit 403 that provides a differential output signal on differential output node OUT1 and OUT2 in response to a differential input (i.e., VIN1 and VIN2, e.g., a differential "square" wave varying from a quiescent voltage by $+\Delta V_{IN}$ and $-\Delta V_{IN}$, respectively). Driver circuit 403 adapts to variations in the impedance of load circuit 406 to provide a differential output signal on differential output node OUT1 and OUT2 that has a predetermined differential voltage swing and a predetermined common mode voltage and the ability to source current to differential output node OUT1 and OUT2 and the ability to sink currents from differential output node OUT1 and OUT2. Accordingly, driver circuit 403 may be integrated with other CMOS circuitry and incorporated into various printed circuit board applications as a classic PECL driver regardless of existing termination circuitry.

TABLE 1

Typical Specifications for Representative Output Standards

| Parameter | LVDS | LVPECL (Input Standard) | LVPECL (Output Standard) | CML |
|---|---|---|---|---|
| $V_{OH}$ | <2.4 V | $V_{CC} - 1.16\ V < V_{OH} < V_{CC} - 0.88\ V$ | $V_{CC} - 1.025\ V < V_{OH} < V_{CC} - 0.88\ V$ | $<V_{CC} + 0.2\ V$ |
| $V_{OL}$ | >0 V | $V_{CC} - 1.81 < V_{OL} < V_{CC} - 1.48$ | $V_{CC} - 1.81\ V < V_{OL} < V_{CC} - 1.62\ V$ | $>V_{CC} - 0.6\ V$ |
| $V_{OD}$ | >100 mV | — | — | 400 mV $< V_{OD} <$ 1200 mV |

Driver circuit 403 includes a current-mode logic (CML) buffer circuit, i.e., a buffer circuit based on a differential pair of devices, e.g., buffer circuit 402. In general, CML buffer circuits can operate with lower signal voltages and at higher frequencies at lower supply voltages than the CMOS circuits described above with reference to FIG. 3A and FIG. 3B. The differential voltage swing of the differential signal provided to differential output node OUT1 and OUT2 is controlled by bias generator circuit 408. The common mode voltage of the differential signal provided to OUT1 and OUT2 is controlled by common mode feedback circuit 404.

Figure 5:
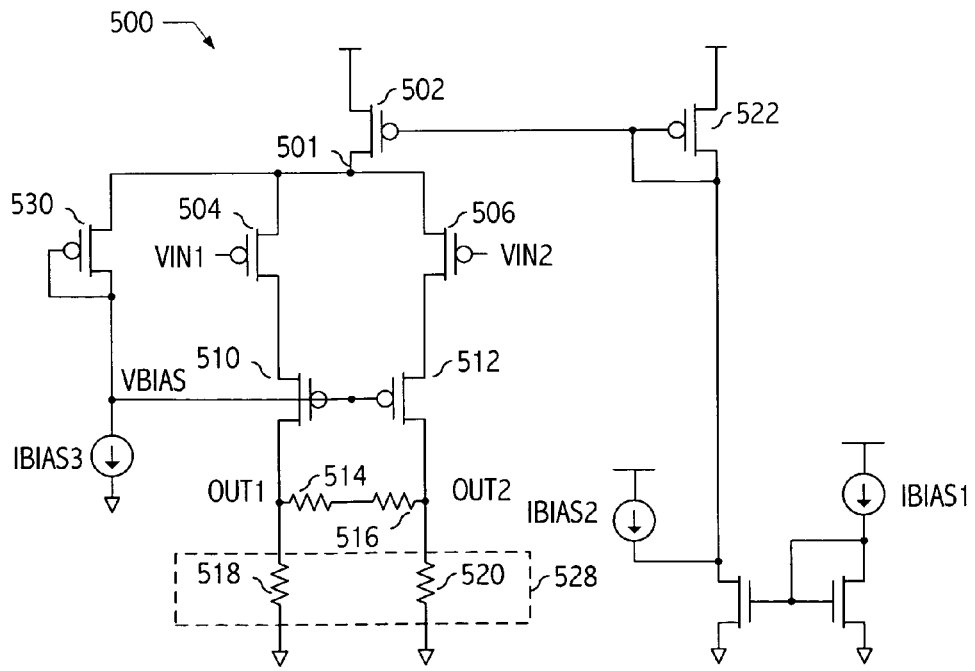
FIG. 5 is a circuit diagram illustrating a buffer circuit consistent with at least one embodiment of the invention.

Referring to FIG. 5, an exemplary buffer consistent with at least one embodiment of the present invention includes a differential pair of devices (e.g., devices 504 and 506) coupled to a common node (e.g., node 501). During typical operation, VIN1 and VIN2 receive a differential voltage, e.g., a differential "square" wave varying from a quiescent voltage by $+\Delta V_{IN}$ and $-\Delta V_{IN}$, respectively). As the differential voltage on VIN1 and VIN2 varies from the quiescent voltage by $+\Delta V_{IN}$ and $-\Delta V_{IN}$, respectively, the current in the left branch, i.e., the current through OUT1, decreases by $\Delta I$ because $V_{GS}$ of device 504 decreases and the current in the right branch, i.e., the current through OUT2, increases by $\Delta I$ because $V_{GS}$ of device 506 increases. Accordingly, OUT2 increases from the common mode voltage and OUT1 decreases from the common mode voltage. For a predetermined input range, e.g., $VIN1_{MIN} \leq (VIN1, VIN2) \leq VIN1_{MAX}$, the output voltage varies $OUT1_{MIN} \leq (OUT1, OUT2) \leq OUT1_{MAX}$, i.e., the output voltage swing is $V_{OD} = OUT1_{MAX} - OUT1_{MIN}$. The output voltage swing of differential circuit 500 may be varied, as described below, by selectively enabling additional differential pairs, which may be coupled to the differential output node OUT1 and OUT2. Increasing the currents through differential output node OUT1 and OUT2 according to the values of VIN1 and VIN2 increases the differential between the currents flowing through the respective branches. The increased differential current produces a proportional increase in differential voltages, differential output node OUT1 and OUT2, increasing the output voltage swing.

Node 501 receives a current that is adjusted to maintain the particular differential voltage swing on differential output node OUT1 and OUT2. Devices 502 and 522 mirror a current that includes the sum of a fixed component (e.g., BIAS1) and a variable component (e.g., IBIAS2) that is based on the differential voltage swing of the differential signal on differential output node OUT1 and OUT2. IBIAS1 may be a current mirrored from a current reference or may be a fixed current generated by another suitable technique.

In some embodiments of the present invention, devices 510 and 512 are coupled between the differential pair formed by devices 504 and 506 and the differential output node OUT1 and OUT2. Devices 510 and 512 are in a cascode configuration coupled to a bias voltage (e.g., VBIAS generated by current source IBIAS3 and device 530). The output impedance of the buffer of FIG. 5 (e.g., resistors 514 and 516) is 200Ω on each of OUT1 and OUT2. However, resistors 514 and 516 may be determined by trading off power consumption with impedance matching to the transmission lines coupled to differential output node OUT1 and OUT2. Lower resistor values increase power consumption and higher resistor values increase signal reflections, which generally degrades performance (e.g., degrades a signal-to-noise ratio of a signal delivered to receiver 401).

Figure 6:
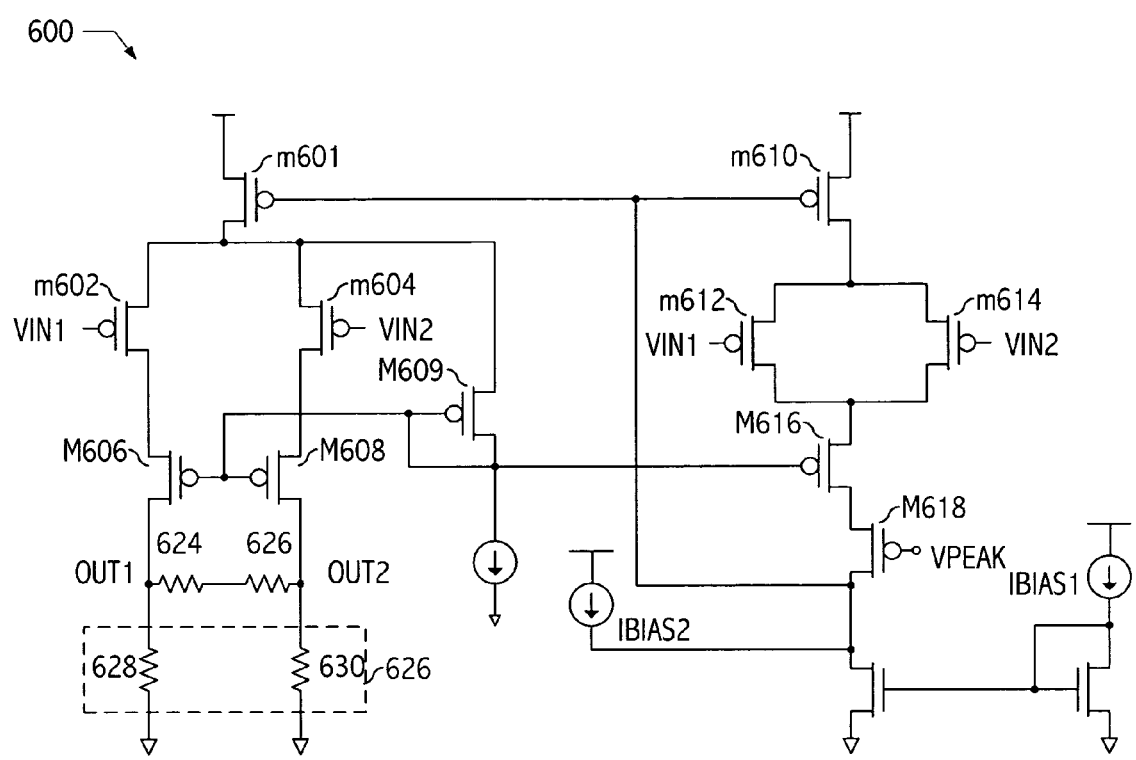
FIG. 6 is a circuit diagram illustrating a buffer circuit consistent with at least one embodiment of the invention.

Referring to FIG. 6, in at least one embodiment of the invention, a CML buffer circuit (e.g., buffer circuit 600) includes cascode devices M606 and M608 that differ from the differential pair devices m602 and m604. For example, cascode devices M606 and M608 are high voltage devices having a different threshold voltage from devices m602 and m604 (as designated by 'M' preceding the reference number of high threshold voltage devices and 'm' preceding the reference number of low threshold voltage devices). The low threshold voltage devices operate at higher frequencies than the high threshold voltage devices. The high threshold voltage devices withstand high voltages coupled to OUT1 and OUT2.

In at least one embodiment of the invention, buffer circuit 600 reduces effects of process variations as compared to buffer circuit 500 by a replica biasing technique that attempts to match current densities of devices m601 and m610 by matching the drain voltage of the mirror device m610 to the drain voltage of device m601. Devices m612, m614, M616, and M618 are included to match the voltage at the drain of m610 to the voltage at the drain of m601 introduced by devices m602, m604, M606, and M608. Device M618, which is controlled by a peak output voltage (e.g., VPEAK) provided by bias generator 408, approximates a voltage drop introduced by the output load.

Although buffer circuits 500 and 600 are shown including p-type devices, these circuits may be modified to include n-type devices. However, n-type designs may dissipate more power than the p-type designs of buffer circuits 500 and 600. P-type designs of buffer circuits 500 and 600 provide current from the current source (the current from device 502 of buffer circuit 500 and the current from device m601 of buffer circuit 600) to the common mode feedback circuit 404 and/or the load circuit 406. When no load circuit is coupled to driver circuit 403, all of the current provided from the current source flows into common mode feedback circuit 404. When a load circuit is coupled to driver circuit 403, some of the current from the current source flows into the load. Such reuse of the current from the current source does not occur for parallel n-type designs of buffer circuits 500 and 606. Parallel n-type designs of buffer circuits 500 and 600 would draw current from the power supply to drive the impedance of load circuit 406, in addition to the current drawn by a current sink to provide the predetermined output. Thus, parallel n-type designs of buffer circuits 500 and 600 consume more power than the corresponding p-type designs of buffer circuits 500 and 600 when a load circuit is coupled to driver circuit 403.

Figure 7:
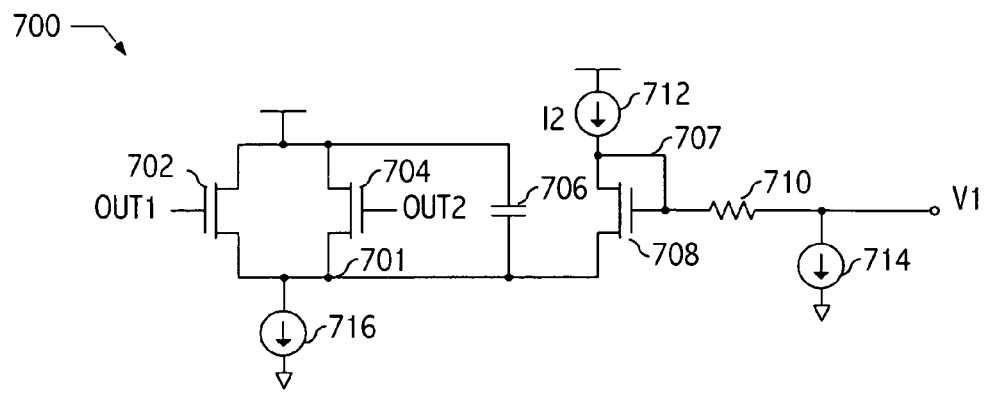
FIG. 7 is a circuit diagram illustrating a peak voltage detection circuit consistent with at least one embodiment of the invention.

Referring back to FIG. 4, bias generator circuit 408 provides at least IBIAS2 to buffer circuit 402. In at least one embodiment of the invention bias generator circuit 408 includes a peak-to-peak voltage detection circuit to generate IBIAS2 based on the differential voltage swing of the signal on differential output node OUT1 and OUT2. An exemplary peak detection circuit (e.g., peak detection circuit 700 of FIG. 7) converts the signal on differential output node OUT1 and OUT2 to a DC voltage signal. Node 701 reaches a bias voltage that is a threshold voltage below the greater of the voltages on differential output node OUT1 and OUT2, i.e., a threshold voltage below a maximum voltage of the voltages on differential output node OUT1 and OUT2. Capacitor 706 is sized large enough to hold node 701 at the bias voltage during transitions of the differential signal on differential output node OUT1 and OUT2 from the maximum voltage. A diode-connected device (e.g., device 708) raises the voltage at node 701 by a voltage that is approximately the threshold voltage of devices 702 and 704, making the voltage on node 707 approximately the maximum voltage of the voltages on differential output node OUT1 and OUT2.

Accordingly, the voltage on node 707 may be provided to buffer 600 as VPEAK to bias M618.

In at least one embodiment of the invention, the voltage on node 707 of peak detector 700 is compared to a reference voltage and the result of the comparison (i.e., the difference between the voltage on node 707 and the reference voltage) is used to set bias current IBIAS2 (i.e., bias generator 408 includes a peak voltage detection circuit rather than a peak-to-peak voltage detection circuit). However, a more robust design includes detecting troughs in the differential output signal on differential output node OUT1 and OUT2 to provide peak-to-peak voltage detection.

Figure 8:
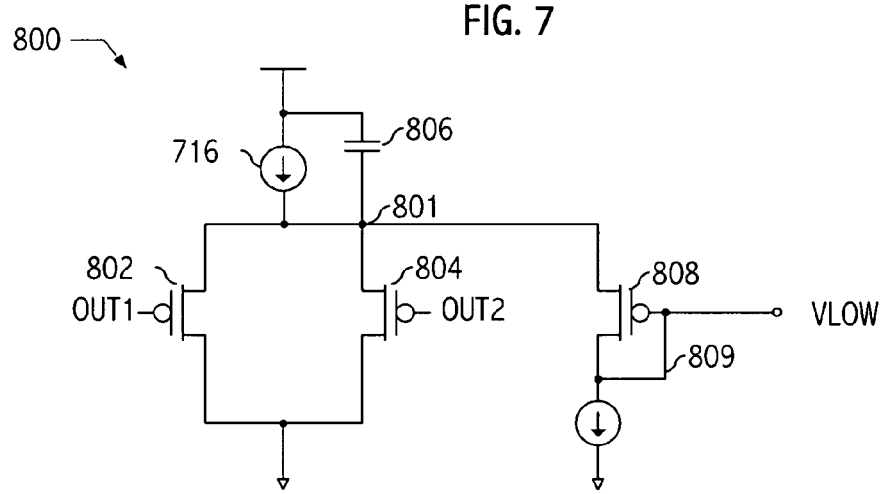
FIG. 8 is a circuit diagram illustrating a trough voltage detection circuit consistent with at least one embodiment of the invention.
Figure 9:
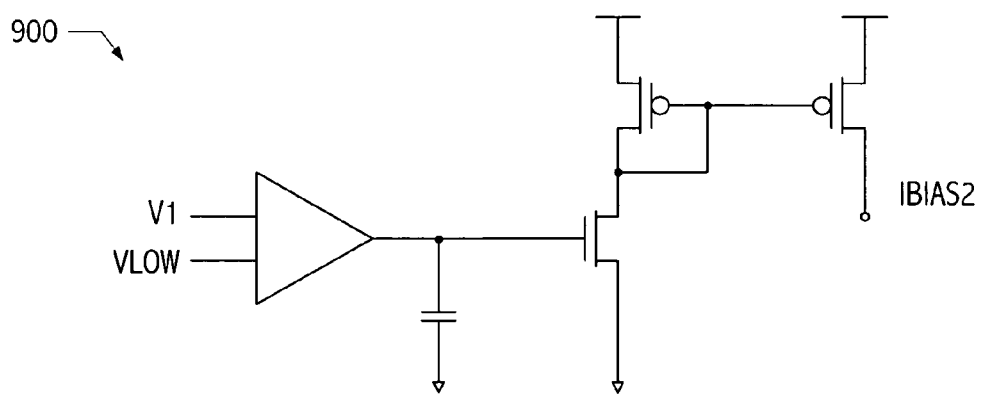
FIG. 9 is a circuit diagram illustrating a comparator circuit of a peak-to-peak voltage detection circuit consistent with at least one embodiment of the invention.

In at least one embodiment of the invention, bias generator circuit 408 includes a trough voltage detection circuit (e.g., trough voltage detection circuit 800 of FIG. 8) to reduce effects of process variations on IBIAS2 and to reduce effects of positive feedback configurations that may be present in a bias generator circuit including only a peak detection circuit. Trough voltage detection circuit 800 converts the signal on differential output node OUT1 and OUT2 to a DC voltage signal. Node 801 reaches a bias voltage that is a threshold voltage above the lesser of the voltages on differential output node OUT1 and OUT2, i.e., a threshold voltage above a minimum voltage of the voltages on differential output node OUT1 and OUT2. Capacitor 806 is sized large enough to hold node 801 at the bias voltage during transitions of differential output node OUT1 and OUT2 from the minimum voltage. A diode-connected device, e.g., device 808 lowers the voltage at node 801 by a voltage that is approximately the threshold voltage of devices 802 and 804 to produce voltage VLOW, which is approximately the minimum voltage of the voltages on differential output node OUT1 and OUT2.

In at least one embodiment of the invention, when the differential voltage swing on differential output node OUT1 and OUT2 is less than the predetermined differential voltage swing, comparator circuit 900 decreases IBIAS2. A decrease in IBIAS2 results in an increase in the current received by the common node of the buffer circuit (e.g., the current mirrored by devices 502 and 502 of buffer 500 or the current mirrored by devices m601 and m610 of buffer 600). An increase in the current received by the common node of the buffer circuit increases the differential voltage swing of a signal on differential output node OUT1 and OUT2. When the differential voltage swing on differential output node OUT1 and OUT2 is greater than the predetermined differential voltage swing, comparator circuit 900 increases IBIAS2. An increase in IBIAS2 results in a decrease in the current received by the common node of the buffer circuit (e.g., the current mirrored by devices 502 and 502 of buffer 500 or the current mirrored by devices m601 and m610 of buffer 600 ). A decrease in the current received by the common node of the buffer circuit decreases the differential voltage swing of a signal on differential output node OUT1 and OUT2.

In a bias generation circuit including both a peak voltage detection circuit and a trough voltage detection circuit, the peak voltage detection circuit may provide an output voltage (e.g., voltage V1) that is less than the voltage on node VHIGH by a voltage drop approximately equal to the predetermined voltage swing (e.g., the voltage drop across resistor 701). Resistor 710 and current source 714 are sized based on the predetermined voltage swing. Comparator circuit 900 compares voltage V1 to voltage VLOW and this voltage difference is converted to a current that is mirrored to generate IBIAS2. Peak detection circuit 700 trough detection circuit 800, and comparator circuit 900 are exemplary and other circuits suitable for generating a bias current based on a voltage swing of a differential signal may be used.

Figure 10:
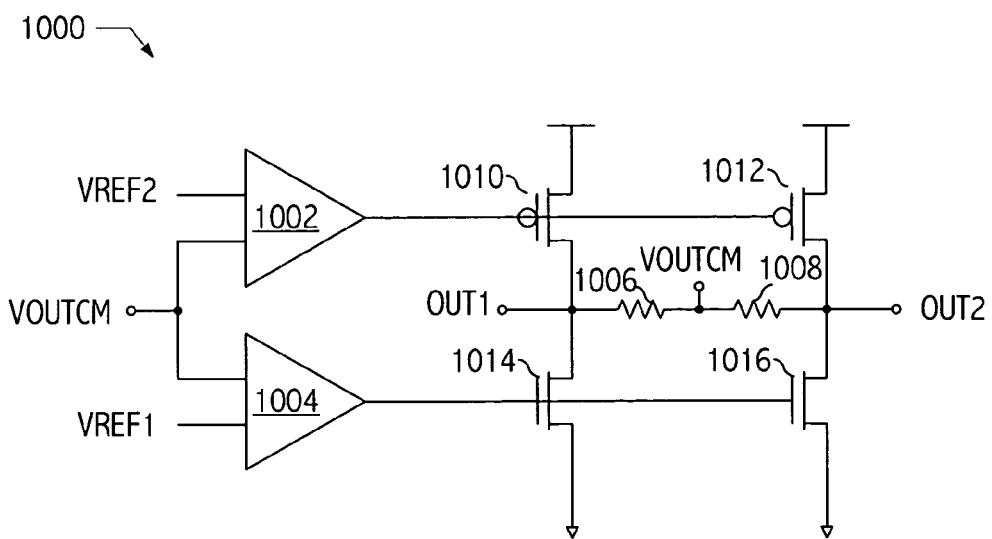
FIG. 10 is a circuit diagram illustrating a common mode feedback circuit consistent with at least one embodiment of the invention.

Referring back to FIG. 4, common mode feedback circuit 404 of driver circuit 403 sets the common mode voltage of the differential signal on differential output node OUT1 and OUT2. Common mode feedback circuit 404 has the ability to source current to differential output node OUT1 and OUT2 and the ability to sink current from differential output node OUT1 and OUT2. An exemplary common mode feedback circuit, e.g., common mode feedback circuit 1000 (FIG. 10), generates a local common mode voltage signal (e.g., VOUTCM) from the voltages on differential output node OUT1 and OUT2 using resistors 1006 and 1008. Resistors 1006 and 1008 are in parallel with output resistors of buffer 402 (e.g., resistors 514 and 516 of buffer 500 or resistors 624 and 626 of buffer 600) and sized larger than the output resistors (e.g., resistors 1006 and 1008 may be 1 kΩ as compared to 200Ω output resistors of a corresponding buffer circuit) to reduce loading of the output by common mode feedback circuit 1000. The local common mode voltage signal is compared to the predetermined common mode voltage and common mode feedback circuit 1000 adjusts the common mode voltage of the differential signal on differential output node OUT1 and OUT2 accordingly.

When VOUTCM is less than a first predetermined output common mode voltage (e.g., VREF2) comparator 1002 provides a voltage to devices 1010 and 1012 that establishes a current to differential output node OUT1 and OUT2 that raises the common mode voltage of the differential signal on differential output node OUT1 and OUT2. When VOUTCM is less than a second predetermined output common mode voltage (e.g., VREF1), comparator 1004 provides a voltage to devices 1014 and 1016 that effectively disables these devices. Accordingly, devices 1010 and 1012 source current through the differential output node OUT1 and OUT2 to the load.

When VOUTCM is greater than the second predetermined output common mode voltage (e.g., VREF1) comparator 1004 provides a voltage to devices 1014 and 1016 that establishes a current from differential output node OUT1 and OUT2 to ground that lowers the output common mode voltage on differential output node OUT1 and OUT2. When VOUTCM is greater than the first predetermined output common mode voltage (e.g., VREF2), comparator 1002 provides a voltage to devices 1002 and 1004 that effectively disables these devices. Accordingly, devices 1014 and 1016 sink current from buffer 402 through the output node to ground.

Under ideal conditions, devices included in comparators 1002 and 1004 are perfectly matched. However, device mismatches may occur, for example, due to integrated circuit manufacturing process variations. These device mismatches may result in an overlap in the VOUTCM voltage ranges that enable the current source path (i.e., the paths through devices 1010 and 1012 from VDD to differential output node OUT1 and OUT2) and current sink paths (i.e., the paths through devices 1014 and 1016 from differential output node OUT1 and OUT2 to ground). Such an overlap in the voltage ranges provides a path between VDD and ground within common mode feedback circuit 1000 thereby dissipating power. Such undesirable power dissipation may be reduced or eliminated by introducing hysteresis into the common mode feedback circuit response. For example, although a common mode feedback circuit could be implemented with a single comparator and a single reference voltage, comparators 1002 and 1004 of common mode feedback circuit 1000 receive corresponding reference voltages VREF1 and VREF2, which are based on the predetermined common mode voltage, but differ by an offset voltage (e.g., 12 mV). The offset voltage may be determined by simulation of process variation effects.

Figure 11:
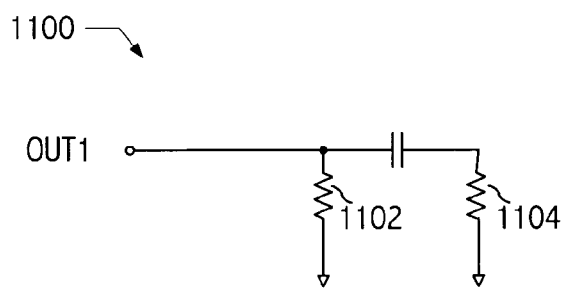
FIG. 11 is a circuit diagram illustrating a load circuit consistent with at least one embodiment of the invention.

Referring back to FIG. 4, common mode feedback circuit 404 will source or sink current to maintain the output common mode voltage on differential output node OUT1 and OUT2, regardless of the impedance of load 406. A total load impedance seen by driver circuit 403 is based on at least the output impedance of driver circuit 403 and the impedance of load 406. Load 406 may provide AC coupling (i.e., coupling of one circuit to another circuit through a capacitor or other device that passes the varying portion but not the static characteristics of an electrical signal) between driver circuit 403 and receiver 401, for example through a load having the form of load circuit 1100 of FIG. 11. Capacitor 1106 of load circuit 1100 substantially reduces a DC component of the signal on OUT1 (i.e., the common mode voltage component), while retaining the AC component which is the voltage swing. Resistor 1104 after the capacitor provides an offset level so that the signal offset falls within the common mode voltage requirements of the receiver circuit. In at least one embodiment of the invention, load 406 has an effective impedance in the range of approximately 25Ω and approximately 200Ω inclusively. However, the techniques described herein may be applied to other effective impedance ranges of load circuits coupled to a driver.

In at least one embodiment of the invention, the output resistance of buffer 402 is 200Ω and resistors 1102 and 1104 are 100Ω and 50Ω, respectively, resulting in a total load impedance of approximately 29Ω. To maintain an exemplary LVPECL single-ended output voltage swing requirement of 0.75V peak-to-peak, driver circuit 403 provides a bias current of approximately 26 mA. In at least one embodiment of the invention, resistor 1102 is 200Ω, resulting in a total load impedance of approximately 33Ω. To maintain an exemplary LVPECL single-ended output voltage swing requirement of 0.75V peak-to-peak, driver circuit 403 provides a bias current of approximately 23 mA. In single-ended load embodiments (e.g., loads of FIG. 11 and 12), the unused terminal is coupled to a load approximately equal to the load of the used terminal to balance the loading of differential output node OUT1 and OUT2.

Figure 12:
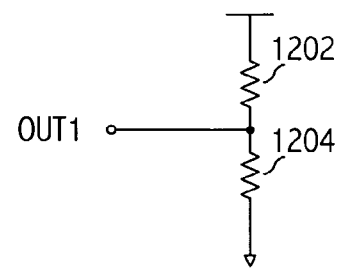
FIG. 12 is a circuit diagram illustrating a load circuit consistent with at least one embodiment of the invention.
Figure 13:
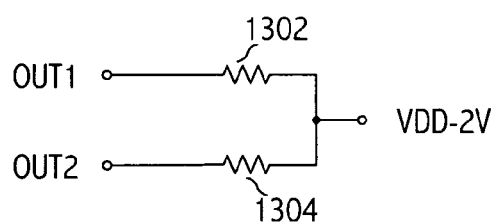
FIG. 13 is a circuit diagram illustrating a load circuit consistent with at least one embodiment of the invention.
Figure 14:
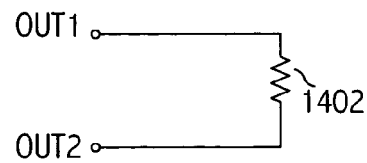
FIG. 14 is a circuit diagram illustrating a load circuit consistent with at least one embodiment of the invention.

Load 406 may provide dc coupling (i.e., coupling by a circuit that passes the steady-state characteristics of a signal and that substantially reduces the transient or oscillating characteristics of the signal) between driver circuit 403 and receiver 401. For example, circuit 406 may have the form of the circuits illustrated in FIG. 12-14. In at least one embodiment of the invention, resistors 1202 and 1204 of FIG. 12 are 124Ω and 84.5Ω, respectively for a 3.3V power supply voltage. Resistors 1202 and 1204 may be 250Ω and 62.5Ω for a 2.5V power supply voltage. The resulting load impedance is approximately 40Ω. To maintain an exemplary LVPECL single-ended output voltage swing requirement of 0.75V peak-to-peak, driver circuit 403 provides a bias current of approximately 18.75 mA. In at least one embodiment of the invention, resistors 1302 and 1304 of FIG. 13 are 50Ω each. The resulting load impedance is approximately 40Ω. To maintain an exemplary LVPECL output voltage swing requirement of 0.75V peak-to-peak, driver circuit 403 provides a bias current of approximately 18.75 mA. The load circuits and resistor values of FIG. 11-14 are exemplary and other load circuits, e.g., load circuits including active loads, other resistor values, or matching other impedances, may be used.

Referring back to FIG. 4, in at least one embodiment of the invention, the predetermined common mode voltage and the predetermined differential voltage swing of driver circuit 403 are programmable. The mode of driver circuit 403 may be selected by configuration block 420, e.g., digital logic, non-volatile memory control, or other suitable technique. The configuration block 420 selects an appropriate one of multiple bias generation circuits. Buffer circuits 500 and 600 may be configured according to a selected mode of the driver by techniques described in U.S. patent application Ser. No. 10/878,197, filed Jun. 28, 2004, entitled "Multiple Signal Format Output Buffer", naming Jerrell P. Hein, Bruce P. DelSignore, and Akhil K. Garlapati as inventors, which application is hereby incorporated by reference.

Figure 15:
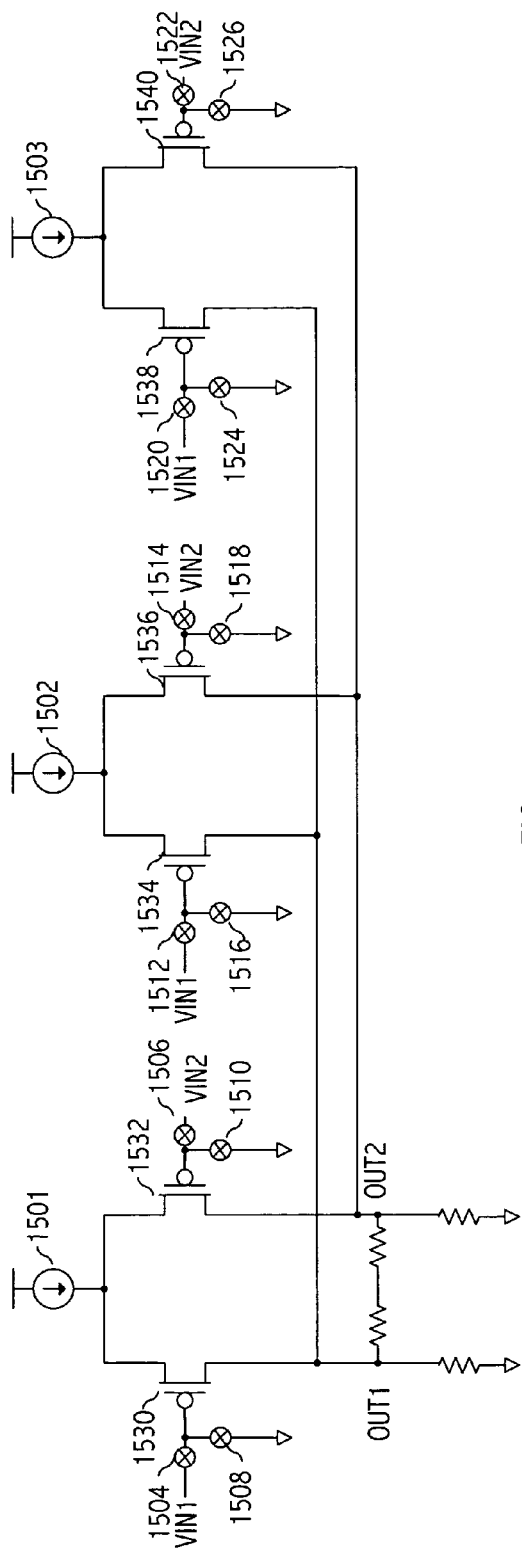
FIG. 15 is a circuit diagram illustrating a buffer circuit configured consistent with at least one embodiment of the invention.

Referring to FIG. 15, switches of an exemplary buffer circuit selectively couple a current source to the differential pair to enable appropriate differential pairs. Switches 1512, 1514, . . . , 1526 may be configured according to configuration block 420 and may be any suitable switching device that support an 'open' and 'closed' mode. For example, switches 1512, 1514, . . . , 1526, may be a MOSFET switch. During typical operation, switches 1504 and 1506 are closed and 1508 and 1510 are open, enabling devices 1530 and 1532. In some embodiments of the present invention, additional devices are coupled between the differential pair formed by devices 1530 and 1532 and the load in a cascode configuration. If the manufacturing technology affords it, such cascode devices could be of a same type or different type (e.g., high voltage, different $V_t$) as devices 1530 and 1532.

In operation, when 1512 is open, and 1516 is closed, VIN1 is decoupled from the gate of device 1534 and the gate of device 1534 is coupled to ground, effectively disabling device 1534. The current flowing through OUT1 and OUT2 may be increased from $I_{1501}$ to $_{1150}+I_{1502}$ by opening switches 1516 and 1518, and closing switches 1512 and 1514. The additional current, $I_{1502}$, will be driven by devices 1534 and 1536 to flow through differential output node OUT1 and OUT2 according to the values of VIN1 and VIN2. Similarly, an additional current, $I_{1503}$ may be introduced by switches 1520, 1522, 1523, and 1524 to be steered by devices 1538 and 1540 through the differential output node OUT1 and OUT2 according to the values of VIN1 and VIN2.

Figure 16:
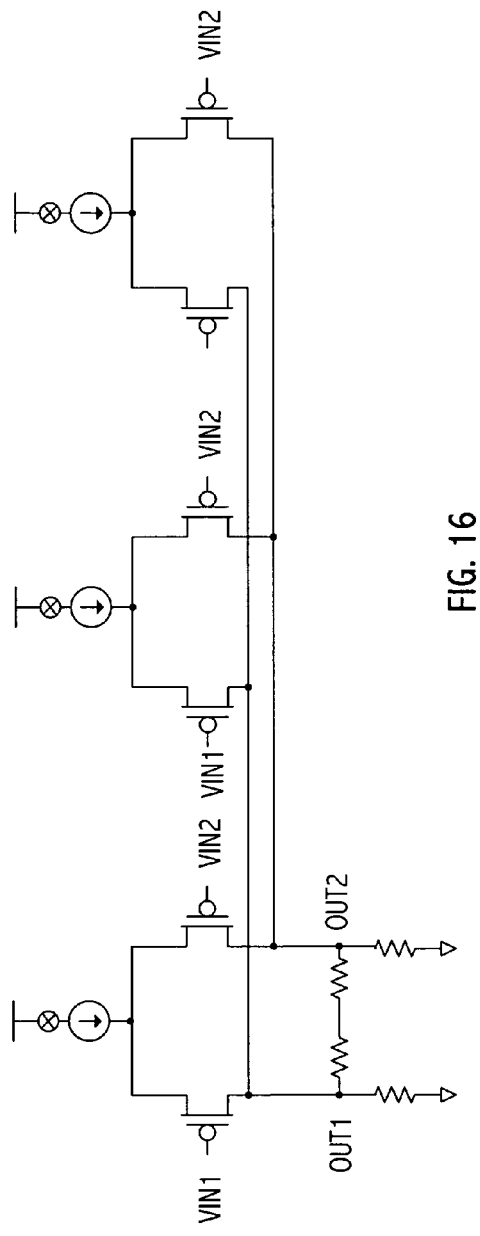
FIG. 16 is a circuit diagram illustrating a buffer circuit configured consistent with at least one embodiment of the invention.
Figure 17:
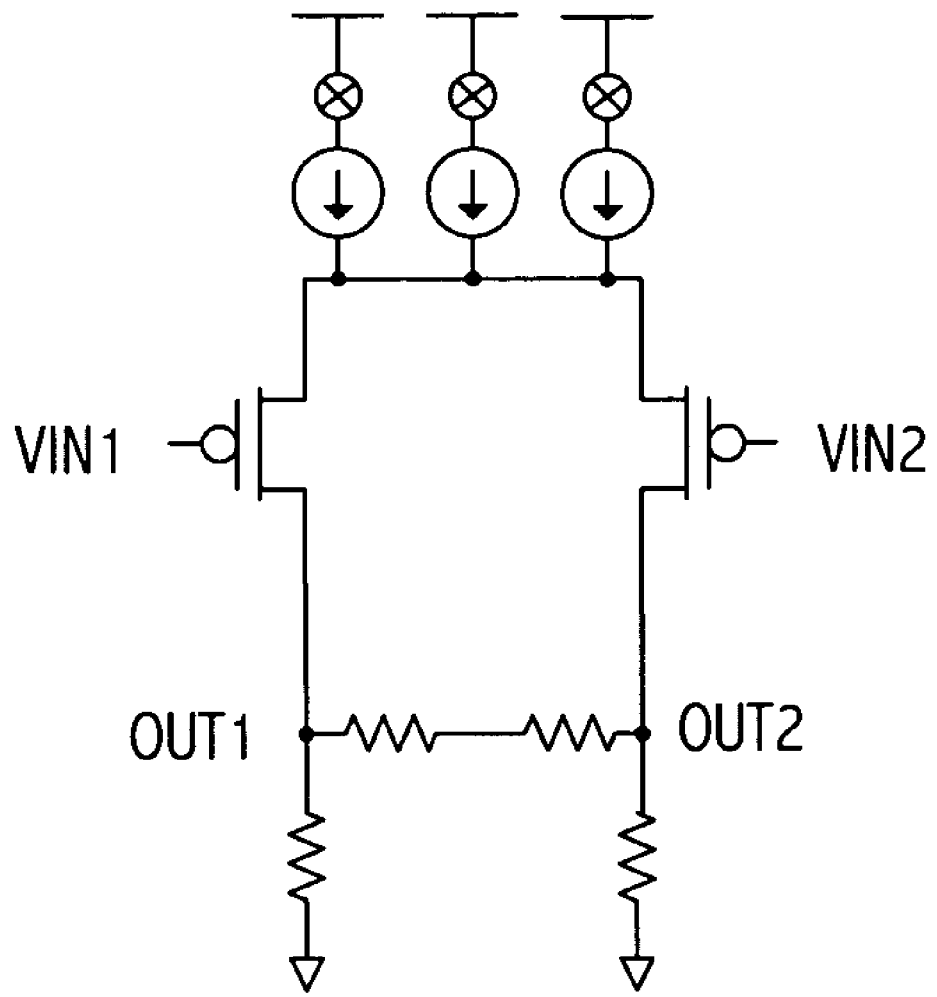
FIG. 17 is a circuit diagram illustrating a buffer circuit configured consistent with at least one embodiment of the invention.

Increasing the currents through the left and right loads according to the values of VIN1 and VIN2 increases the differential between the currents flowing through the branches. The increased differential current produces a proportional increase in differential voltages, differential output node OUT1 and OUT2, increasing the differential voltage swing. By appropriately sizing devices 1530, 1532, . . . , 1540 and current sources $I_{1501}$, $I_{1502}$, and $I_{1503}$, differential voltage swings consistent with various specifications may be achieved. Switches 1512, 1514, . . . , 1526 may also be configured to disable the current sources 1501, 1502, and 1503, for a sleep mode in which only at most negligible currents flow through the left and right loads. In at least one embodiment of the invention, switches selectively couple the current source to the differential pair to enable the differential pair (FIG. 16). In addition, alternative or additional current sources may be selectively coupled to a differential pair (FIG. 17).

In an exemplary embodiment, three differential pairs are selectively enabled to realize the LVDS, LVPECL, and CML standards, as summarized in Table 2

TABLE 2

Summary of Differential Circuit Configurations

| Standard | Current |
| --- | --- |
| LVDS | $I_{1501}$ |
| LVPECL (input standard) | $I_{1501} + I_{1502}$ |
| LVPECL (output standard) | $I_{1501} + I_{1502} + I_{1503}$ |
| CML | $I_{1501}$ |
| LVDS (high swing) | $I_{1501} + I_{1502}$ |

Based on the above configurations of buffer circuit 1501, the common mode voltages and output swing voltages in Table 1 may be achieved.

While circuits and physical structures are generally presumed, it is well recognized that in modern semiconductor design and fabrication, physical structures and circuits may be embodied in computer readable descriptive form suitable for use in subsequent design, test or fabrication stages. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer readable medium includes at least disk, tape, or other magnetic, optical, semiconductor (e.g., flash memory cards, ROM), or electronic medium and a network, wireline, wireless or other communications medium.

What is claimed is:

1. An integrated circuit comprising:
   a buffer circuit including a differential input node, a common node, a differential pair of devices coupled to the differential input node and the common node, a differential output node, and a current source coupled to the common node,
   wherein the buffer circuit is configured to provide a differential output signal on the differential output node, the differential output signal having a differential voltage swing and a common mode voltage and being provided based on at least a differential input signal on the differential input node, a particular differential voltage swing, a particular common mode voltage, the differential voltage swing of the differential output signal, and the common mode voltage of the differential output signal.

2. The integrated circuit, as recited in claim 1, wherein the current source is configured to provide a first current, the first current flowing from the common node into the differential output node and wherein at least a portion of the first current flows into a load circuit from the differential output node, thereby reusing current from the current source.

3. The integrated circuit, as recited in claim 2, further comprising:
   a common mode feedback circuit coupled to the differential output node, the common mode feedback circuit responsive to the common mode voltage of the differential output signal and configured to provide a second current, the second current flowing between the differential output node and one of a power supply node and a ground node.

4. The integrated circuit, as recited in claim 3, wherein at least a portion of the first current includes the second current, the second current flowing into the common mode feedback circuit.

5. The integrated circuit, as recited in claim 3, wherein the second current flows from the common mode feedback circuit into the load circuit.

6. The integrated circuit, as recited in claim 2, further comprising:
   a control circuit coupled to the current source, the control circuit being configured to provide a variable current to the current source, the variable current being based on a difference between the particular differential voltage swing and the differential voltage swing of the differential output signal.

7. The integrated circuit, as recited in claim 6, wherein the first current is based on at least the variable current and a fixed current.

8. The integrated circuit, as recited in claim 1, wherein the common mode voltage of the differential output signal is approximately equal to the particular common mode voltage and the differential voltage swing of the differential output signal is approximately equal to the particular differential voltage swing when a load circuit coupled to the differential output node includes any of a single-ended load circuit having a first impedance for dc coupling the differential output node to a receiver input node, a differential load circuit having a second impedance for dc coupling the differential output node to the receiver input node, and another load circuit having a third impedance for ac coupling the differential output node to the receiver input node.

9. The integrated circuit, as recited in claim 1, wherein the common mode voltage of the differential output signal is approximately equal to the particular common mode voltage and the differential voltage swing of the differential output signal is approximately equal to the particular differential voltage swing when a load circuit coupled to the differential output node has any impedance in the range of approximately 25Ω to approximately 200Ω, inclusively.

10. The integrated circuit, as recited in claim 1, wherein the differential output signal is compliant with at least one of low-voltage positive emitter-coupled logic (LVPECL), low-voltage differential signaling (LVDS), and current-mode logic (CML) standards.

11. The integrated circuit, as recited in claim 1, wherein the particular differential voltage swing and the particular common mode voltage are programmable.

12. The integrated circuit, as recited in claim 11, wherein the particular common mode voltage is determined at least in part by a selected voltage reference coupled to the common mode feedback circuit.

13. The integrated circuit, as recited in claim 11, wherein the particular differential voltage swing is determined at least in part by a selectively enabled set of differential pairs coupled to the common node.

14. A method comprising:
   providing a differential output signal to a differential output node, the differential output signal having a differential voltage swing and a common mode voltage, the differential output signal being based on at least a differential input signal, a particular differential voltage swing, a particular common mode voltage, the differential voltage swing of the differential output signal, and the common mode voltage of the differential output signal.

15. The method, as recited in claim 14, wherein the providing includes generating a first current having a fixed current component and a variable current component based on at least the differential voltage swing of the differential output signal, at least a portion of the first current flowing from the differential output node to the load circuit.

16. The method, as recited in claim 15, wherein the providing includes generating a second current based on at least the common mode voltage of the differential output signal, the second current flowing from the differential output node to the load circuit.

17. The method, as recited in claim 15, wherein the providing includes sinking at least a portion of the first current from the differential output node to a ground node based on at least the common mode voltage of the differential output signal.

18. The method, as recited in claim 15, wherein generating the first current includes detecting at least one voltage of a peak voltage of the differential output signal and a trough voltage of the differential output signal and providing the variable current component based on the particular differential voltage swing and the at least one detected voltage.

19. The method, as recited in claim 14, wherein the common mode voltage of the differential output signal is approximately equal to the particular common mode voltage and the differential voltage swing of the differential output signal is approximately equal to the particular differential voltage swing when a load circuit coupled to the differential output node includes any of a single-ended load circuit having a first impedance for dc coupling the differential output node to a receiver input node, a differential load circuit having a second impedance for dc coupling the differential output node to the receiver input node, and another load circuit having a third impedance for ac coupling the differential output node to the receiver input node.

20. The method, as recited in claim 14, wherein the common mode voltage of the differential output signal is approximately equal to the particular common mode voltage and the differential voltage swing of the differential output signal is approximately equal to the particular differential voltage swing when a load circuit coupled to the differential output node has any impedance in the range of approximately 25Ω to approximately 200Ω, inclusively.

21. The method, as recited in claim 14, wherein the differential output signal is programmable to be compliant with one of low-voltage positive emitter-coupled logic (LVPECL), low-voltage differential signaling (LVDS), and current-mode logic (CML)standards.

22. The method, as recited in claim 14, further comprising:
determining the particular common mode voltage according to a selected output standard; and
determining the particular differential voltage swing according to the selected output standard.

23. An apparatus comprising:
a differential output node; and
means for providing a differential output signal to a differential output node, the differential output signal having a differential voltage swing and a common mode voltage, the differential output signal being based on at least a differential input signal, a particular differential voltage swing, a particular common mode voltage, the differential voltage swing of the differential output signal, and the common mode voltage of the differential output signal.

24. The apparatus, as recited in claim 23, wherein the means for providing includes means for generating a first current, the first current having a fixed current component and a variable current component based on at least the particular differential voltage swing and the differential voltage swing of the differential output signal.

25. The apparatus, as recited in claim 23, wherein the means for providing includes means for reducing a common mode error of the common mode voltage of the differential output signal.

26. The apparatus, as recited in claim 23, wherein the common mode voltage of the differential output signal is approximately equal to the particular common mode voltage and the differential voltage swing of the differential output signal is approximately equal to the particular differential voltage swing when a load circuit coupled to the differential output node includes any of a single-ended load circuit having a first impedance for dc coupling the differential output node to a receiver input node, a differential load circuit having a second impedance for dc coupling the differential output node to the receiver input node, and another load circuit having a third impedance for ac coupling the differential output node to the receiver input node.

27. The apparatus, as recited in claim 23, wherein the common mode voltage of the differential output signal is approximately equal to the particular common mode voltage and the differential voltage swing of the differential output signal is approximately equal to the particular differential voltage swing when a load circuit coupled to the differential output node has any impedance in the range of approximately 25Ω to approximately 200Ω, inclusively.

28. The apparatus, as recited in claim 23, further comprising:
means for selecting the particular differential voltage swing and the particular common mode voltage from a plurality of output standards including an output common mode voltage and a differential voltage swing.

29. The apparatus, as recited in claim 28, wherein the output standards include low-voltage positive emitter-coupled logic (LVPECL) standard, a low-voltage differential signaling (LVDS) standard, and a current-mode logic (CML) standard.

* * * * *